US011383641B2

(12) United States Patent
Cardimen et al.

(10) Patent No.: US 11,383,641 B2
(45) Date of Patent: Jul. 12, 2022

(54) SYSTEM AND METHOD FOR A REMOTE VEHICLE LIGHT CHECK

(71) Applicant: Honda Motor Co., Ltd., Tokyo (JP)

(72) Inventors: Peter J. Cardimen, Powell, OH (US); Thomas J. Sladek, Jr., Hilliard, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 382 days.

(21) Appl. No.: 16/203,492

(22) Filed: Nov. 28, 2018

(65) Prior Publication Data

US 2020/0164798 A1 May 28, 2020

(51) Int. Cl.
*B60Q 11/00* (2006.01)
*G07C 5/00* (2006.01)

(52) U.S. Cl.
CPC ............ *B60Q 11/005* (2013.01); *G07C 5/008* (2013.01)

(58) Field of Classification Search
CPC .. B60Q 11/005; B60Q 2900/30; G07C 5/008; G07C 5/0825; B62D 63/08; G01R 31/44
See application file for complete search history.

(56) References Cited

U.S. PATENT DOCUMENTS

| | | | |
|---|---|---|---|
| 4,866,390 A | 9/1989 | Butchko | |
| 6,066,951 A | 5/2000 | Maass | |
| 6,154,035 A * | 11/2000 | Aguirre | G01R 31/44 324/503 |
| 6,557,952 B1 | 5/2003 | Robertson et al. | |
| 7,106,068 B2 | 9/2006 | Lahr et al. | |
| 7,132,935 B2 * | 11/2006 | Bolander | B60Q 11/00 340/438 |
| 8,816,691 B2 | 8/2014 | Miller et al. | |
| 8,816,697 B2 | 8/2014 | Miller et al. | |
| 8,947,096 B1 | 2/2015 | Wolf | |
| 9,162,612 B2 | 10/2015 | Hanson et al. | |
| 2003/0052532 A1 | 3/2003 | Costello et al. | |
| 2006/0170427 A1 * | 8/2006 | Lahr | B60Q 11/005 324/504 |
| 2016/0167630 A1 | 6/2016 | Wolf | |
| 2017/0120802 A1 * | 5/2017 | Decaluwe | H05B 47/11 |
| 2017/0313240 A1 * | 11/2017 | Randolph | B60T 7/02 |
| 2018/0009377 A1 | 1/2018 | Troutman et al. | |
| 2018/0043821 A1 * | 2/2018 | Dixon | B60Q 11/005 |
| 2018/0288848 A1 * | 10/2018 | Gao | H04N 7/183 |
| 2019/0126822 A1 * | 5/2019 | Kobayashi | B60Q 11/005 |

FOREIGN PATENT DOCUMENTS

| | | | | |
|---|---|---|---|---|
| DE | 102014001834 | | 8/2014 | |
| WO | WO-2019010538 A1 * | 1/2019 | | G01R 31/006 |

* cited by examiner

*Primary Examiner* — Nadeem Odeh
(74) *Attorney, Agent, or Firm* — Mark E. Duell; Rankin Hill & Clark LLP

(57) ABSTRACT

Systems and methods for a remote vehicle light check of a host vehicle having a plurality of lights is provided. In one embodiment, a method includes detecting a lighting check signal at a host vehicle having lights. The lighting check signal is received from a trigger device. The method also includes triggering a light sequence in response to the lighting check signal being detected. The light sequence causes one or more lights of the plurality of lights to be activated. The method further includes activating the one or more lights based on the light sequence. The method further includes pausing the activation of the one more lights by a predetermined delay.

20 Claims, 7 Drawing Sheets

SYSTEM AND METHOD FOR A REMOTE VEHICLE LIGHT CHECK

BACKGROUND

Vehicles have a number of lights for signaling and warning. However, it is difficult for a vehicle occupant to both actuate the lights of a vehicle and monitor that the lights actually have illuminated. For example, a vehicle occupant cannot both actuate the brakes of the vehicle using the brake pedal and stand behind the vehicle to see the brake light illuminate. Furthermore, when vehicles are coupled together, the lights of the first vehicle can be extended to a second vehicle by electrically connecting the first vehicle to the second vehicle. For example, when a brake light of the first vehicle is illuminated, a brake light of the second vehicle, corresponding to the brake light of the first vehicle may also be illuminated. However, it is difficult to verify that the electrical connection between the first vehicle and the second vehicle has been properly made from inside the first vehicle.

BRIEF DESCRIPTION

According to one aspect, a computer-implemented method for performing a remote vehicle light check is provided. The method includes detecting a lighting check signal at a host vehicle having a plurality of lights. The lighting check signal is received from a trigger device. The method also includes triggering a light sequence in response to the lighting check signal being detected. The light sequence causes one or more lights of the plurality of lights to be activated. The method further includes activating the one or more lights based on the light sequence. The method also includes pausing the activation of the one or more lights by a predetermined delay before continuing the activation of the one or more lights.

According to another aspect, a system for a remote vehicle light check of associated with a host vehicle is provided. The system includes a receiving module, a trigger module, a delay module, and a light system. The receiving module detects a lighting check signal at the host vehicle. The receiving module also identifies a first set of lights associated with the host vehicle and a second set of lights associated with a coupled device electrically connected to the host vehicle. The trigger module triggers a light sequence in response to the lighting check signal being detected. The light sequence causes one or more lights of the second set of lights to be activated. The light system activates the one or more lights of the second set of lights based on the light sequence. The delay module pauses the activation of the one or more lights of the second set of lights.

According to a further aspect, a non-transitory computer-readable storage medium is provided for storing instructions that, when executed by a computer, causes the computer to perform a method. The method includes detecting a lighting check signal at a host vehicle. The lighting check signal is received from a trigger device. The method also includes identifying a first set of lights associated with the host vehicle and a second set of lights associated with a coupled device electrically connected to the host vehicle.

The method further includes triggering a light sequence in response to the lighting check signal being detected. The method includes activating the one or more lights of the second set of lights based on the light sequence. The method also includes pausing the activation of the one or more lights of the second set of lights.

DETAILED DESCRIPTION

Figure 1:
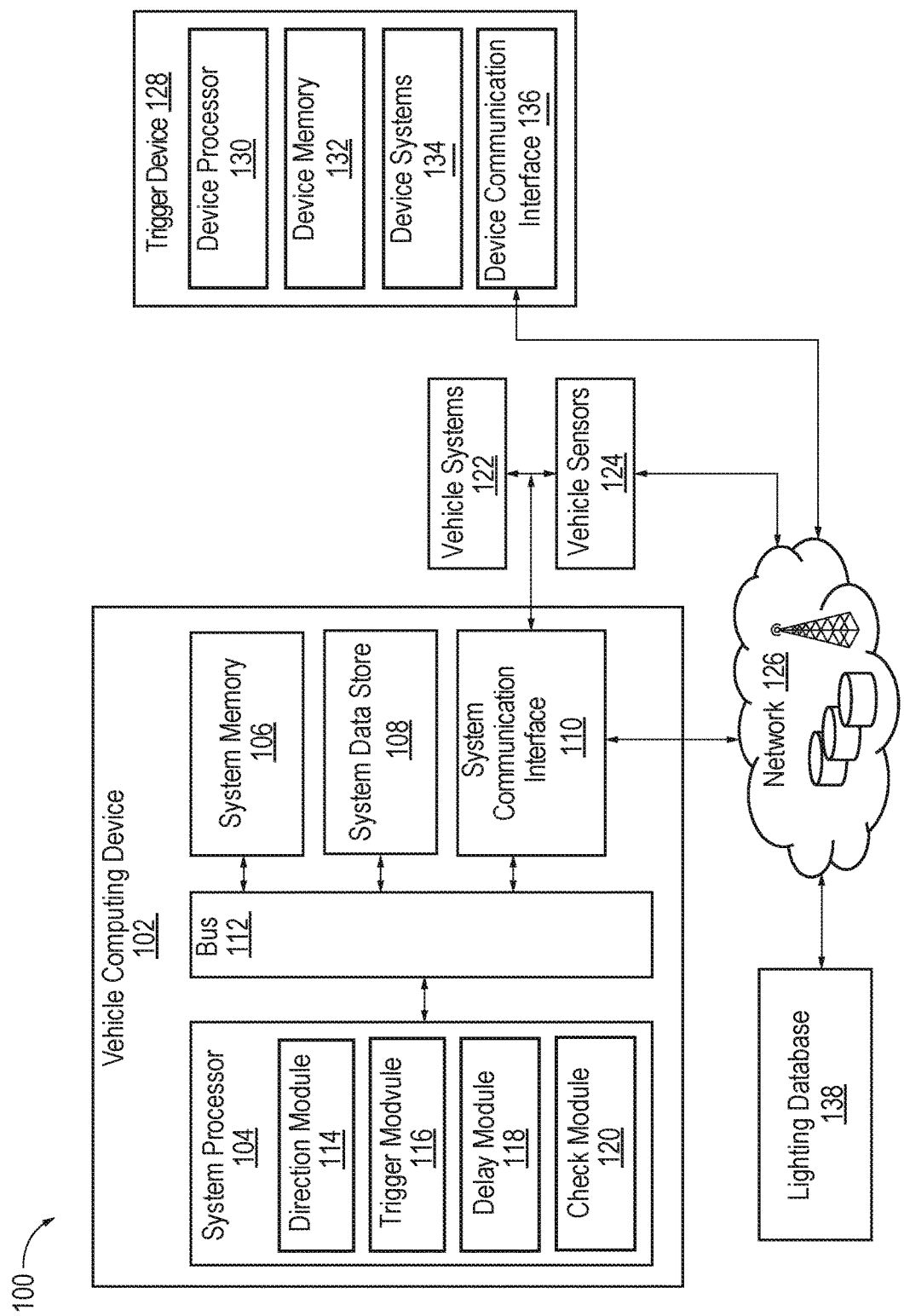
FIG. 1 is a schematic diagram of an operating environment for implementing systems and methods for a remote vehicle light check according to an exemplary embodiment.

Generally, the systems and methods disclosed herein are directed to performing a remote vehicle light check that allows a user to activate a light sequence of lights on a host vehicle. The host vehicle detects a lighting check signal. The lighting check signal may be received from a trigger device, such as a key fob, smart watch, tablet, or smart phone, among others. In response to detecting the lighting check signal, a light sequence is triggered. The light sequence causes one or more lights of the host vehicle to be activated in a predetermined order. The activation of at least some of the one or more lights can be delayed prior to or during the light sequence. The delay may allow the user to move about the host vehicle. For example, the delay may allow a user to monitor the headlights of the host vehicle being activated, move to the rear of the host vehicle, and monitor the brake lights being activated. In this manner, the user can remotely activate the lights of the host vehicle which facilitates the user monitoring the activation.

In another embodiment, the remote vehicle light check can be used to check light systems of the host vehicle electrically connected to a coupled device, such as a light harness, towed vehicle (e.g., trailer, recreational vehicle, etc.), and portable sirens, among others. For example, when a lighting check signal is detected, lights associated with the coupled device are identified. Triggering the light sequence, in response to the lighting check signal being detected, causes the lights of the coupled device to be activated. The one or more lights of the second set of lights are then based on the light sequence. The activation can be paused by a predetermined delay. By allowing the user to remotely activate and delay a light sequence, the systems and methods described herein aid the user in determining whether the lights of the host vehicle and/or the coupled device are being successfully activated.

Definitions

The following includes definitions of selected terms employed herein. The definitions include various examples and/or forms of components that fall within the scope of a term and that can be used for implementation. The examples are not intended to be limiting.

A "bus," as used herein, refers to an interconnected architecture that is operably connected to other computer components inside a computer or between computers. The bus can transfer data between the computer components. The bus can be a memory bus, a memory controller, a peripheral bus, an external bus, a crossbar switch, and/or a local bus, among others. The bus can also be a vehicle bus that interconnects components inside a vehicle using protocols such as Media Oriented Systems Transport (MOST), Controller Area network (CAN), Local Interconnect Network (LIN), among others.

"Computer communication," as used herein, refers to a communication between two or more computing devices (e.g., computer, personal digital assistant, cellular telephone, network device, vehicle, vehicle computing device, infrastructure device, roadside device) and can be, for example, a network transfer, a data transfer, a file transfer, an applet transfer, an email, a hypertext transfer protocol (HTTP) transfer, and so on. A computer communication can occur across any type of wired or wireless system and/or network having any type of configuration, for example, a local area network (LAN), a personal area network (PAN), a wireless personal area network (WPAN), a wireless network (WAN), a wide area network (WAN), a metropolitan area network (MAN), a virtual private network (VPN), a cellular network, a token ring network, a point-to-point network, an ad hoc network, a mobile ad hoc network, a vehicular ad hoc network (VANET), a vehicle-to-vehicle (V2V) network, a vehicle-to-everything (V2X) network, a vehicle-to-infrastructure (V2I) network, among others. Computer communication can utilize any type of wired, wireless, or network communication protocol including, but not limited to, Ethernet (e.g., IEEE 802.3), WiFi (e.g., IEEE 802.11), communications access for land mobiles (CALM), WiMax, Bluetooth, Zigbee, ultra-wideband (UWAB), multiple-input and multiple-output (MIMO), telecommunications and/or cellular network communication (e.g., SMS, MMS, 3G, 4G, LTE, 5G, GSM, CDMA, WAVE), satellite, dedicated short range communication (DSRC), among others.

A "coupled device" as used herein can refer to any device that can be electrically connected to a vehicle. Exemplary coupled devices may include, but are not limited to vehicles (e.g., trailers, recreational vehicles, boats, mobility devices to assist a user with mobility, etc.), and electrical devices (e.g., light harness, portable sirens, etc.), among others. In embodiments in which the coupled device is a vehicle, the coupled device may be a coupled vehicle being towed by a host vehicle.

A "disk," as used herein can be, for example, a magnetic disk drive, a solid state disk drive, a floppy disk drive, a tape drive, a Zip drive, a flash memory card, and/or a memory stick. Furthermore, the disk can be a CD-ROM (compact disk ROM), a CD recordable drive (CD-R drive), a CD rewritable drive (CD-RW drive), and/or a digital video ROM drive (DVD ROM). The disk can store an operating system that controls or allocates resources of a computing device.

"Data store," as used herein can be, for example, a magnetic disk drive, a solid-state disk drive, a floppy disk drive, a tape drive, a Zip drive, a flash memory card, and/or a memory stick. Furthermore, the disk can be a CD-ROM (compact disk ROM), a CD recordable drive (CD-R drive), a CD rewritable drive (CD-RW drive), and/or a digital video ROM drive (DVD ROM). The disk can store an operating system that controls or allocates resources of a computing device.

A "database," as used herein can refer to table, a set of tables, a set of data stores and/or methods for accessing and/or manipulating those data stores. Some databases can be incorporated with a disk as defined above.

"Display," as used herein can include, but is not limited to, LED display panels, LCD display panels, CRT display, plasma display panels, touch screen displays, among others, that are often found on trigger devices to display information. The display can receive input (e.g., touch input, keyboard input, input from various other input devices, etc.) from a user.

"Input/output device" (I/O device) as used herein can include devices for receiving input and/or devices for outputting data. The input and/or output can be for controlling different features which include various components, systems, and subsystems. Specifically, the term "input device" includes, but it not limited to: keyboard, microphones, pointing and selection devices, cameras, imaging devices, video cards, displays, push buttons, rotary knobs, and the like. The term "input device" additionally includes graphical input controls that take place within a user interface which can be displayed by various types of mechanisms such as software and hardware-based controls, interfaces, touch screens, touch pads or plug and play devices. An "output device" includes, but is not limited to: display devices, and other devices for outputting information and functions.

"Logic circuitry," as used herein, includes, but is not limited to, hardware, firmware, a non-transitory computer readable medium that stores instructions, instructions in execution on a machine, and/or to cause (e.g., execute) an action(s) from another logic circuitry, module, method and/or system. Logic circuitry can include and/or be a part of a processor controlled by an algorithm, a discrete logic (e.g., ASIC), an analog circuit, a digital circuit, a programmed logic device, a memory device containing instructions, and so on. Logic can include one or more gates, combinations of gates, or other circuit components. Where multiple logics are described, it can be possible to incorporate the multiple logics into one physical logic. Similarly, where a single logic is described, it can be possible to distribute that single logic between multiple physical logics.

A "memory," as used herein can include volatile memory and/or non-volatile memory. Non-volatile memory can include, for example, ROM (read only memory), PROM (programmable read only memory), EPROM (erasable PROM), and EEPROM (electrically erasable PROM). Volatile memory can include, for example, RAM (random access memory), synchronous RAM (SRAM), dynamic RAM (DRAM), synchronous DRAM (SDRAM), double data rate SDRAM (DDR SDRAM), and direct RAM bus RAM (DR-RAM). The memory can store an operating system that controls or allocates resources of a computing device.

A "module," as used herein, includes, but is not limited to, non-transitory computer readable medium that stores instructions, instructions in execution on a machine, hardware, firmware, software in execution on a machine, and/or combinations of each to perform a function(s) or an action (s), and/or to cause a function or action from another module, method, and/or system. A module may also include logic, a software-controlled microprocessor, a discrete logic circuit, an analog circuit, a digital circuit, a programmed logic device, a memory device containing executing instructions, logic gates, a combination of gates, and/or other circuit components. Multiple modules may be combined into one module and single modules may be distributed among multiple modules.

"Obstacle", as used herein, refers to any objects in the roadway and may include pedestrians crossing the roadway, other vehicles, animals, debris, potholes, etc. Further, an 'obstacle' may include most any traffic conditions, road conditions, weather conditions, etc. Examples of obstacles may include, but are not necessarily limited to other vehicles (e.g., obstacle vehicle), buildings, landmarks, obstructions in the roadway, road segments, intersections, etc. Thus, obstacles may be found, detected, or associated with a path, one or more road segments, etc. along a route on which a vehicle is travelling or is projected to travel along.

An "operable connection," or a connection by which entities are "operably connected," is one in which signals, physical communications, and/or logical communications can be sent and/or received. An operable connection can include a wireless interface, a physical interface, a data interface, and/or an electrical interface.

A "processor," as used herein, processes signals and performs general computing and arithmetic functions. Signals processed by the processor can include digital signals, data signals, computer instructions, processor instructions, messages, a bit, a bit stream, or other means that can be received, transmitted and/or detected. Generally, the processor can be a variety of various processors including multiple single and multicore processors and co-processors and other multiple single and multicore processor and co-processor architectures. The processor can include various modules to execute various functions.

A "trigger device," as used herein, is a computing device typically capable of computer communication. The trigger device may be a portable device. The trigger device may have a display screen with user input (e.g., touch, keyboard) and a processor for computing. Trigger devices include, but are not limited to, handheld devices, mobile devices, smart phones, laptops, in-vehicle display, tablets and e-readers. In some embodiments, a "trigger device" could refer to a remote device that includes a processor for computing and/or a communication interface for receiving and transmitting data remotely. In other embodiments, the trigger device may be a device for facilitating remote communication with a vehicle systems. For example, the trigger device may be a key fob that remotely controls the security system including the door locks, alarms, etc.

A "vehicle," as used herein, refers to any moving vehicle that is capable of carrying one or more human occupants and is powered by any form of energy. The term "vehicle" includes, but is not limited to cars, trucks, vans, minivans, SUVs, motorcycles, scooters, boats, go-karts, amusement ride cars, rail transport, personal watercraft, and aircraft. In some cases, a motor vehicle includes one or more engines. Further, the term "vehicle" can refer to an electric vehicle (EV) that is capable of carrying one or more human occupants and is powered entirely or partially by one or more electric motors powered by an electric battery. The EV can include battery electric vehicles (BEV) and plug-in hybrid electric vehicles (PHEV). The term "vehicle" can also refer to an autonomous vehicle and/or self-driving vehicle powered by any form of energy. The autonomous vehicle may or may not carry one or more human occupants. Further, the term "vehicle" can include vehicles that are automated or non-automated with pre-determined paths or free-moving vehicles.

A "vehicle system," as used herein can include, but is not limited to, any automatic or manual systems that can be used to enhance the vehicle, driving, and/or safety. Exemplary vehicle systems include, but are not limited to: an electronic stability control system, an anti-lock brake system, a brake assist system, an automatic brake prefill system, a low speed follow system, a cruise control system, a collision warning system, a collision mitigation braking system, an auto cruise control system, a lane departure warning system, a blind spot indicator system, a lane keep assist system, a navigation system, a transmission system, brake pedal systems, an electronic power steering system, visual devices (e.g., camera systems, proximity sensor systems), a climate control system, an electronic pretensioning system, a monitoring system, a passenger detection system, a vehicle suspension system, a vehicle seat configuration system, a vehicle cabin lighting system, an audio system, a sensory system, among others.

I. System Overview

Referring now to the drawings, wherein the showings are for purposes of illustrating exemplary embodiments and not for purposes of limiting the same, FIG. 1 is a schematic diagram of an operating environment 100 for a remote vehicle light check. The components of operating environment 100, as well as the components of other systems, hardware architectures, and software architectures discussed herein, can be combined, omitted, or organized into different architectures for various embodiments. Further, the components of the operating environment 100 can be implemented with or associated with a host vehicle.

In the illustrated embodiment of FIG. 1, the operating environment 100 includes a vehicle computing device (VCD) 102 with provisions for processing, communicating and interacting with various components of a vehicle and other components of the operating environment 100. In one embodiment, the VCD 102 can be implemented with a host vehicle 202 (shown in FIG. 2), for example, as part of a telematics unit, a head unit, a navigation unit, an infotainment unit, an electronic control unit, among others. In other embodiments, the components and functions of the VCD 102 can be implemented remotely from the host vehicle 202, for example, with a trigger device 128 of a user 204 or another device connected via a network (e.g., a network 126).

Generally, the VCD 102 includes a system processor 104, a system memory 106, a system data store 108, and a system communication interface 110, which are each operably connected for computer communication via a bus 112 and/or other wired and wireless technologies. The system communication interface 110 is an I/O interface that provides software and hardware to facilitate data input and output between the components of the VCD 102 and other components, networks, and data sources, which will be described herein. Additionally, the system processor 104 includes a detection module 114, a trigger module 116, a delay module 118, and a check module 120, for assisting the host vehicle 202 in performing a remote vehicle light check of lights, facilitated by the components of the operating environment 100. The lights of the host vehicle 202 may include, for example, a first headlight 208, a second headlight 210, a first forward turn signal 212, a second forward turn signal 214, a first rear turn signal 216, a second rear turn signal 218, a first brake light 220, and a second brake light 222.

Figure 3:
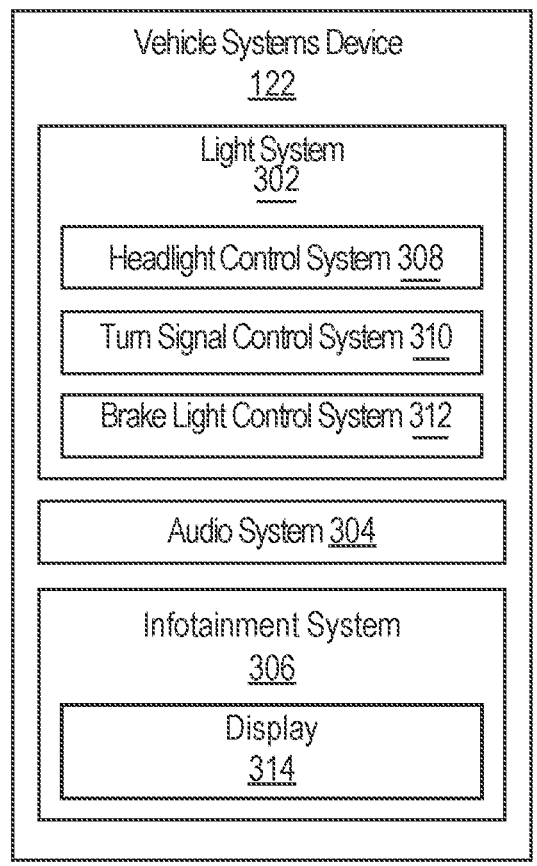
FIG. 3 is an example of vehicle systems for implementing a system for a remote vehicle light check according to an exemplary embodiment.

The VCD 102 is also operably connected for computer communication (e.g., via the bus 112 and/or the system communication interface 110) to one or more vehicle systems 122. Turning to FIG. 3, the vehicle systems 122 can include, but are not limited to, any automatic or manual systems that can be used to enhance the host vehicle 202, driving, and/or safety. As shown in FIG. 3, the vehicle systems 122 include a light system 302, an audio system 304, and an infotainment system 306 according to an exemplary embodiment. The light system 302 controls the lights of the host vehicle 202 to actuate, including, for example, exterior lights (e.g., turn signal lights) and/or interior lights such as the dashboard lights. For example, the light system 302 may include a headlight control system 308 for controlling the first headlight 208 and the second headlight 210. A turn signal control system 310 controls the first forward turn signal 212, the second forward turn signal 214, the first rear turn signal 216, and the second rear turn signal 218. A brake light control system 312 controls the first brake light 220 and the second brake light 222. The audio system 304 controls audio (e.g., audio content, volume) in the host vehicle 202. The infotainment system 306 provides visual information and/or entertainment. The infotainment system can include an in-vehicle display 314 that displays the visual information and/or the entertainment, and also acts as a user interface.

The vehicle systems 122 include and/or are operably connected for computer communication to various vehicle sensors 124. The vehicle sensors 124 provide and/or sense information associated with the vehicle, the vehicle environment, and/or the vehicle systems 122. The vehicle sensors 124 can include, but are not limited to, vehicle sensors associated with the vehicle systems 122, other vehicle sensors associated with the host vehicle 202, and/or vehicle sensors that collect data regarding the surrounding environment to the host vehicle 202.

The vehicle sensors 124 may be, but are not limited to, environmental sensors, vehicle speed sensors, accelerator pedal sensors, brake sensors, throttle position sensors, wheel sensors, anti-lock brake sensors, camshaft sensors, among others. In some embodiments, the vehicle sensors 124 are incorporated with the vehicle systems 122. For example, one or more vehicle sensors 124 may be incorporated with the light system 302 to monitor the activation of the lights of the host vehicle 202.

Additionally or alternatively, the vehicle sensors 124 can include, but are not limited to, image sensors, such as cameras, optical sensors, radio sensors, etc. mounted to the interior or exterior of the host vehicle 202 and light sensors, such as light detection and ranging (LiDAR) sensors, radar, laser sensors etc. mounted to the exterior or interior of the host vehicle 202. Further, vehicle sensors 124 can include sensors external to the host vehicle 202 (accessed, for example, via the network 126), for example, external cameras, radar and laser sensors on other vehicles in a vehicle-to-vehicle network, street cameras, surveillance cameras, among others. The vehicle sensors 124 monitor the environment of the host vehicle 202. For example, the vehicle sensors 124 may be used to detect the presence of coupled devices, users, etc. Accordingly, the vehicle sensors 124 are operable to sense data associated with the vehicle environment, the vehicle systems 122, and/or the host vehicle 202, and generate a data signal indicating a measurement of the sensed data. These data signals can be converted into other data formats (e.g., numerical) and/or used by the vehicle systems 122 and/or the VCD 102 to generate other data metrics and parameters. The vehicle sensors 124 can be any type of sensor, for example, acoustic, electric, environmental, optical, imaging, light, pressure, force, thermal, temperature, proximity, among others.

The VCD is also operatively connected for computer communication. The connection from the system communication interface 110 to the network 126, the trigger device 128, and the lighting database 138, can be facilitated in various ways. For example, through a network connection (e.g., wired or wireless), a cellular data network from the trigger device 128, etc.

The network 126 is, for example, a data network, the Internet, a wide area network, a local area network, or cellular data network. The network 126 serves as a communication medium to various remote devices (e.g., databases, web servers, remote systems, application servers, intermediary servers, client machines, other trigger devices). In some embodiments, the trigger device 128 can be accessed through the network 126, and/or the network 126 can access the trigger device 128. Thus, in some embodiments, the VCD 102 can obtain data from the trigger device 128 via the network 126.

The VCD 102 can transmit and receive information directly or indirectly to and from the trigger device 128. The trigger device 128 can include a device processor 130, a device memory 132, device systems 134, and a device communication interface 136 that are configured to be in communication with one another. Because the trigger device 128 may have limited data storage availability or functionality, data transmission can be executed at and/or with other infrastructures and servers. For example, the trigger device 128 can transmit and receive information directly or indirectly to and from the VCD 102, the vehicle systems 122, the vehicle sensors 124, and the lighting database 138, over the network 126.

The VCD 102 is also operatively connected for computer communication to the network 126 and a lighting database 138. The system communication interface 110 to the network 126, and the lighting database 138 can be facilitated in various ways. For example, through a network connection (e.g., wired or wireless), a cellular data network from a trigger device (not shown), a vehicle to vehicle ad-hoc network (not shown), an in-vehicle network (not shown), among others, or any combination of thereof. In some embodiments, the lighting database 138 could be located on-board the vehicle, at for example, the system memory 106 and/or the system data store 108. In other embodiments, the lighting database 138 can be distributed in one or more locations.

The network 126 is, for example, a data network, the Internet, a wide area network or a local area network. The network 126 serves as a communication medium to various remote devices (e.g., databases, web servers, remote servers, application servers, intermediary servers, client machines, other trigger devices). In some embodiments, the lighting database 138 may be included in the network 126, accessed by the VCD 102 through the network 126, and/or the network 126 can access the lighting database 138. Thus, in some embodiments, the VCD 102 can obtain data by accessing the lighting database 138 via the network 126.

Figure 2:
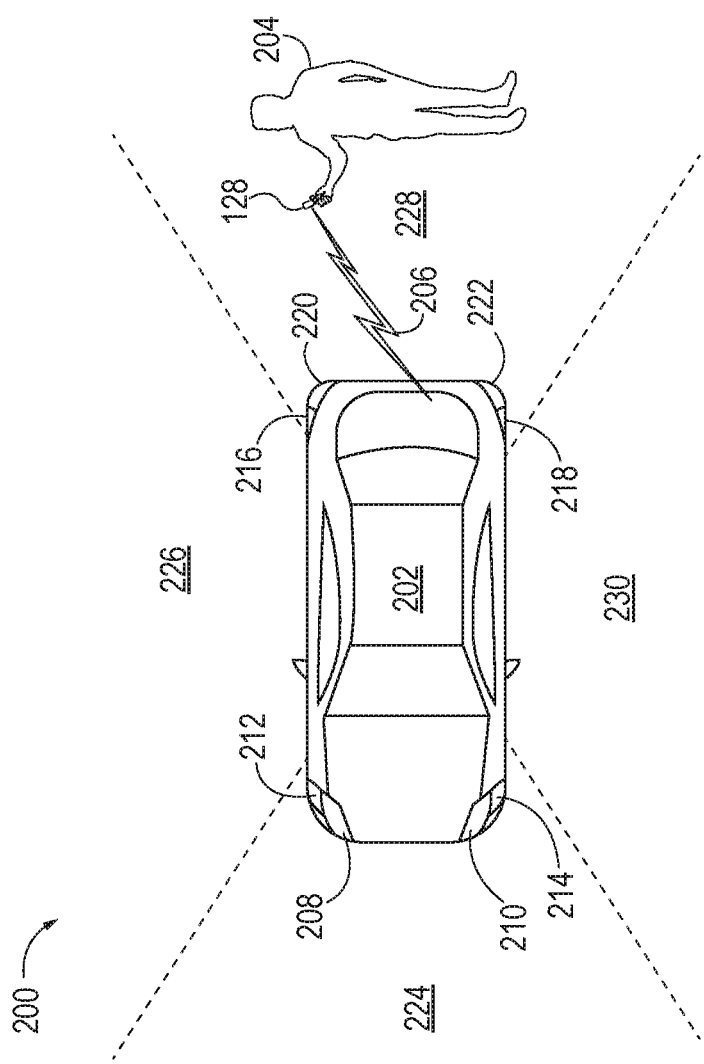
FIG. 2 is a schematic diagram of a vehicle implementing a system for a remote vehicle light check according to an exemplary embodiment.

The application of systems and methods are described with respect to the host vehicle 202, shown in FIG. 2. The host vehicle 202 is a vehicle having the operating environment 100 described above. As discussed above, the host vehicle 202 will be described with respect to with the trigger device 128 and the user 204. For example, the trigger device 128 may include the in-vehicle display 314 of the infotainment system 306 as the infotainment system 306 can transmit and receive information directly or indirectly to and from the VCD 102. For clarity, the trigger device 128 is described with respect to a single device, but multiple devices may be associated with the trigger device 128. Furthermore, the trigger device may be distributed among multiple devices, for example, if light data based on the remote vehicle light check is displayed on the trigger device 128, the light data may also be displayed on the in-vehicle display 314 of the infotainment system 306.

Using the system and network configuration discussed above, a remote vehicle light check can be performed remotely from the host vehicle 202 so that the progression of the light sequence can be monitored. Furthermore, the light sequence can be delayed to facilitate the light sequence being monitored. Detailed embodiments describing exemplary methods using the system and network configuration discussed above will now be discussed in detail.

II. Method

Figure 4:
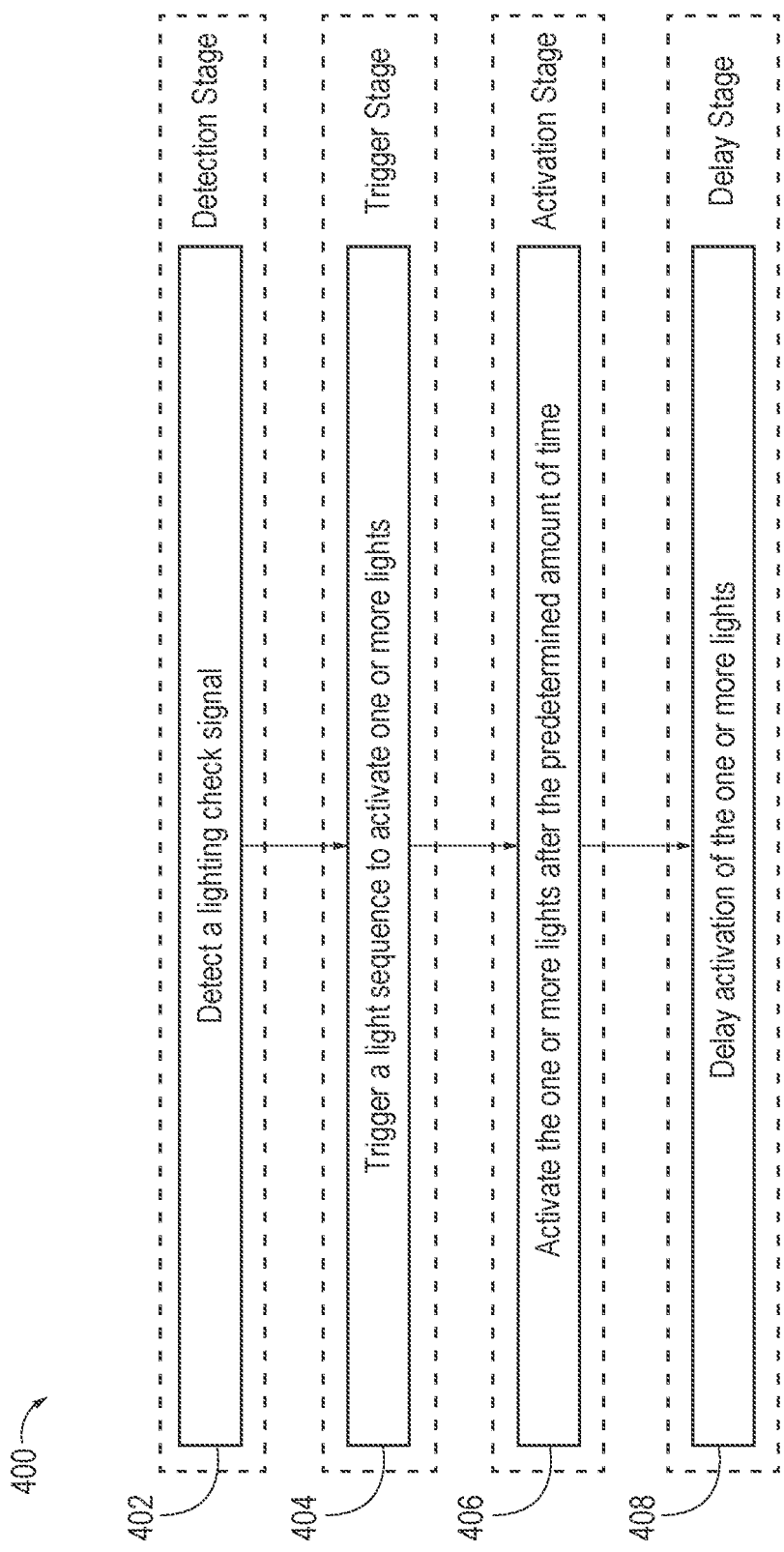
FIG. 4 is a process flow diagram of a method for a remote vehicle light check according to an exemplary embodiment.

Referring now to FIG. 4, a method 400 for a remote vehicle light check will now be described according to an exemplary embodiment. FIG. 4 will also be described with reference to FIGS. 1, 2, and 3.

As shown in FIG. 4, the method for performing a remote vehicle light check can be described by four stages, namely, (A) detection, (B) trigger, (C) activation, and (D) delay. For simplicity, the method 400 will be described by these stages, but it is understood that the elements of the method 400 can be organized into different architectures, blocks, stages, and/or processes.

A. Detection Stage

With respect to FIG. 4, at block 402, the detection stage includes detecting a lighting check signal 206 at the detection module 114. Accordingly, the lighting check signal 206 detection processes described below are performed by, coordinated by, and/or facilitated by the detection module 114 of the host vehicle 202. The detection module 114 may additionally utilize other components of the operating environment 100, including the vehicle systems 122 and/or the vehicle sensors 124.

In some embodiments, the detection module 114 of the host vehicle 202 detects the lighting check signal 206 from the trigger device 128. As shown in FIG. 2, the trigger device 128 may be a key fob. The user 204 may transmit the lighting check signal 206 from the trigger device 128 by pressing a mechanical feature (e.g., button, switch, toggle, stylus, pressure sensor, etc.) of the trigger device 128. In other embodiments, the trigger device 128 may allow the user 204 to select to transmit the lighting check signal 206 using an input device which may be, but is not limited to: keyboard, microphones, pointing and selection devices, cameras, imaging devices, video cards, displays, push buttons, rotary knobs, and the like. The term "input device" additionally includes graphical input controls that take place within a user interface which can be displayed by various types of mechanisms such as software and hardware based controls, interfaces, touch screens, touch pads or plug and play devices.

The lighting check signal 206 is a transmission that communicates that the user 204 would like to perform a remote vehicle light check. The lighting check signal 206 may be generated by the device processor 130. For example, the device processor 130 may generate a wave, electric current, and/or data that is patterned, modulated, and/or coded. The device processor 130 may generate the lighting check signal 206 based on lighting information received from the host vehicle 202 and/or stored in the device memory 132. For example, the device memory 132 may store historical data about the trigger device including a trigger device identifier that can be included in the lighting check signal 206 to identify the trigger device 128 and/or the user 204.

In another embodiment, the device processor 130 may generate the lighting check signal 206 by accessing one or more of the device systems 134. For example, the device systems 134 may include location services that provide the user 204 with on-demand maps of automatically determined device locations based, for example, positioning technology such as satellite navigation (GPS, Galileo, Glonass, etc.) or as some function of Wi-Fi mapping, GSM-based cell signal mapping, RFID tracking, etc. The device systems 134 of the trigger device 128 may also include device tracking using signal triangulation from nearby cell towers to pinpoint the location of the trigger device 128. Similarly, Wi-Fi mapping may be used to locate the trigger device 128 by evaluating signal samples from multiple access points. The device systems 134 may include other systems (e.g., user interface systems, display systems, sensor systems, etc.) as well.

The lighting check signal 206 may be received at the detection module 114 from the device communication interface 136 of the trigger device 128. For example, the device communication interface 136 may include a short-range radio transmitter, such that the device communication interface 136 sends the lighting check signal 206 when the trigger device 128 is actuated to do so by the user 204. The device communication interface 136 may additionally or alternatively include other systems for computer communication that is detectable by the detection module 114. In some embodiments, the detection module 114 may utilize the vehicle systems 122 and/or the vehicle sensors 124 of the host vehicle 202 to detect the lighting check signal 206.

The lighting check signal 206 may be sent once in response to the user 204 actuating the trigger device 128. Alternatively, the lighting check signal 206 may be sent automatically when the trigger device is within a threshold distance of the host vehicle 202. For example, the threshold distance may be the sensor range of the trigger device 128 or the host vehicle 202. In another embodiment, the lighting check signal 206 may be sent periodically according to a predetermined schedule (e.g., every 3 seconds once the host vehicle 202 is sensed). The lighting check signal 206 may also be updated and sent in response to the update.

In addition to communicating that the user 204 would like to perform a remote vehicle light check, the lighting check signal 206 may include the trigger device identifier, historical data, and the location information, among others. Suppose that the lighting check signal 206 is updated to include a new current location of the trigger device 128. The lighting check signal 206 may be updated and transmitted to the detection module 114 based on the update.

B. Trigger Stage

At block 404, the trigger stage includes triggering a light sequence, by the trigger module 116, in response to the lighting check signal 206 being detected. The light sequence causes one or more lights of host vehicle 202 to be activated. Accordingly, the light sequence triggering processes described below are performed by, coordinated by, and/or facilitated by the trigger module 116 of the host vehicle 202. The trigger module 116 may also utilize other components of the operating environment 100, including the vehicle systems 122 and/or the vehicle sensors 124.

The lighting check signal 206 detected by the detection module 114 may include the light sequence or an identifier that indicates where the light sequence is stored. For example, a plurality of light sequences may be stored in the system memory 106 of the VCD 102 or remotely at the lighting database 138. The lighting check signal 206 may include an identifier that indicates one or more light sequences that should be selected from the plurality of light sequences by the trigger module 116.

The light sequence may include a number of parameters such as an identification parameter, timing parameter, and cycle parameter, among others that can be modified by the trigger module 116. The identification parameter identifies one or more lights of the host vehicle 202. For example, the identification parameter may include identifying one or more lights of the host vehicle 202 in a specific order. Accordingly, the identification parameter of the light sequence may identify the first headlight 208, the second headlight 210, the first forward turn signal 212, the second forward turn signal 214, the first rear turn signal 216, the second rear turn signal 218, the first brake light 220, and the second brake light 222 being illuminated separately, in series, in that order.

The identification parameter may also include an illumination pattern for each of the lights of the host vehicle 202. For example, the identification parameter may indicate that the first headlight 208 and the second headlight 210 should be illuminated in a flashing pattern but that the first forward turn signal 212 and the second forward turn signal 214 be illuminated in a constant pattern. Therefore, even though the identified lights are to be illuminated in series the lights may be grouped according to the illumination pattern.

Furthermore, the trigger module 116 may select a light sequence based on the location of the trigger device 128. In one embodiment, the host vehicle 202 may differentiate the vehicle environment 200 into distinct zones. For example, the zones may include a forward zone 224, a passenger zone 226, a rear zone 228, and a driver zone 230. The zones being defined as quadrants is an example embodiment and various configurations may be used. For example, the vehicle environment 200 may have any number of zones. Additionally or alternatively, the trigger module 116 may wait to trigger the light sequence until the trigger device 128 and/or the user 204 is in a position to monitor the light sequence. For example, if the lighting sequence begins with the first headlight 208, the trigger module 116 may wait to trigger the light sequence until the trigger device 128 and/or the user 204 is located in the forward zone 224 or the passenger zone 226.

The identification parameter of the light sequence may identify lights at the front of host vehicle 202, such as the first headlight 208, the second headlight 210, the first forward turn signal 212, and the second forward turn signal 214 when the trigger device 128 is located in the forward zone 224. The location of the trigger device 128 may be based on the location information from the lighting check signal 206. In another embodiment, the location of the trigger device 128 may be determined by the detection module 114 based on vehicle data from the vehicle systems 122 and/or the vehicle sensors 124. For example, the vehicle sensors 124 may include cameras and LiDAR sensors that can capture the vehicle data in the form of images of the trigger device 128 and/or the user 204. The trigger module 116 then uses the orientation of the vehicle sensors 124 and the vehicle data to determine in which quadrant the trigger device 128 and/or the user 204 is located. For example, as shown in FIG. 2, the trigger module 116 may identify that the user is in the rear zone 228. Accordingly, the trigger module 116 may select a light sequence that identifies the rear lights including the first rear turn signal 216, the second rear turn signal 218, the first brake light 220, and the second brake light 222.

The timing parameter may include the timing associated with the light sequence. For example, the timing parameter may include the light sequence being triggered 10 seconds after the lighting check signal 206 is detected. The timing parameter may also include the timing in the order of the light sequence. For example, the timing parameter may indicate that the lights identified in the light sequence be illuminated in series with a ten second gap between the illumination of each of the identified lights. In some embodiments, the timing parameter of the trigger module 116 may be based on vehicle data of the vehicle systems 122 and the vehicle sensors. For example, the vehicle sensors 124 may have vehicle data indicating that it is raining. The trigger module 116 may modify the timing parameter to be longer, for example, increasing the time between the illuminations of each of the identified lights to fifteen second gap, due to the inclement weather.

The cycle parameter may indicate whether the light sequence should be repeated one or more times, and identify incremental changes, if any, that should be made in subsequent cycles. From the example above, suppose that the identification parameter identifies the first headlight 208, the second headlight 210, the first forward turn signal 212, the second forward turn signal 214, the first rear turn signal 216, the second rear turn signal 218, the first brake light 220, and the second brake light 222 being illuminated separately, in series, in that order. The cycle parameter may indicated that in a second cycle that that the lights be illuminated in pairs in series in that order. Accordingly, the second cycle would be different than the first because the first headlight 208 and the second headlight 210 would be illuminated at the same time in the second cycle. Likewise, the first forward turn signal 212 and the second forward turn signal 214 would be illuminated at the same time in the second cycle, as would the first rear turn signal 216 and the second rear turn signal 218, as well as the first brake light 220 and the second brake light 222.

C. Activation Stage

At block 406, the one or more lights of the host vehicle 202, identified in the light sequence, are activated in the activation stage using the vehicle systems 122 and/or the vehicle sensors 124. Accordingly, the activation processes described below are performed by, coordinated by, and/or facilitated by the vehicle systems 122 and/or the vehicle sensors 124 as well as other components of the operating environment 100, including the system processor 104, the system communication interface 110, etc.

In one embodiment, in response to the light sequence being triggered, the light system 302 may activate the lights of the host vehicle 202 based on the light sequence. Accordingly, the trigger module 116 may transmit instructions based on and/or including the light sequence. Continuing the example from above, suppose the light sequence includes the first headlight 208, the second headlight 210, the first forward turn signal 212, the second forward turn signal 214, the first rear turn signal 216, the second rear turn signal 218, the first brake light 220, and the second brake light 222 being illuminated separately, in series, in that order. The light system 302 may coordinate the light system 302 subsystems to activate the lights according to the light sequence. For example, the headlight control system 308 controls the activation of the first headlight 208 and the second headlight 210, the turn signal control system 310 controls the activation of the first forward turn signal 212, the second forward turn signal 214, the first rear turn signal 216, and the second rear turn signal 218, and the brake light control system 312 controls the activation of the first brake light 220 and the second brake light 222.

The light system 302 may ensure that the identification parameter, the timing parameter, and the cycle parameter are satisfied. For example, the light system 302 may coordinate the headlight control system 308, the turn signal control system 310, and the brake light control system 312 to illuminate the lights identified in the light sequence according to the predetermined gap (e.g., every ten seconds) between the lights being illuminated by measuring the voltage of the a light when the light is activated.

D. Delay Stage

At block 408, the delay stage includes delaying the activation of the one or more lights identified in the light sequence by a predetermined delay before continuing the activation of the one or more lights. Accordingly, the delay processes described below are performed by, coordinated by, and/or facilitated by the delay module 118 of the host vehicle 202. The delay module 118 may additionally utilize other components of the operating environment 100, including the vehicle systems 122 and/or the vehicle sensors 124.

The delay may be initiated when a delay signal is received from the trigger device 128. For example, the user 204 may initiate a pause signal being transmitted which is then received by the delay module 118. The pause signal may be received at the detection module 114 and accessed by the delay module 118. In another embodiment, the delay module 118 may initiate the delay based on other information received by the detection module 114. For example, the detection module 114 may receive a lighting check signal 206 that has been updated with current location information for the trigger device 128. If the current location information has changed a threshold amount from the prior location, the delay module 118 may initiate a delay. For example, the threshold amount may be a radial distance from the host vehicle 202, a difference distance between the prior location and the current location of the trigger device 128, or a predetermined threshold distance.

In another embodiment, the delay module 118 may determine the location of the trigger device 128 and/or the user 204. Suppose the detection module 114 receives a lighting check signal 206 for a light sequence that identifies the first headlight 208, the second headlight 210, the first forward turn signal 212, the second forward turn signal 214, the first rear turn signal 216, the second rear turn signal 218, the first brake light 220, and the second brake light 222. As discussed above, if the lighting sequence begins with the first headlight 208, the trigger module 116 may wait to trigger the light sequence until the trigger device 128 and/or the user 204 is located in the forward zone 224 or the passenger zone 226. However, as the light sequence progresses to lights at the rear of the vehicle, the delay module 118 may delay the progress of lighting sequence until the user 204 is in the rear zone 228. Accordingly, the delay module 118 may delay the progress of the activation until the trigger device 128 and/or the user 204 is detected in a zone where the user 204 can visualize the illumination of the rear lights, such as the first rear turn signal 216, the second rear turn signal 218, the first brake light 220, and the second brake light 222. Accordingly, the activation of the light sequence can be delayed, automatically or by the user 204, to facilitate the user 204 monitoring progress of the light sequence.

Figure 5:
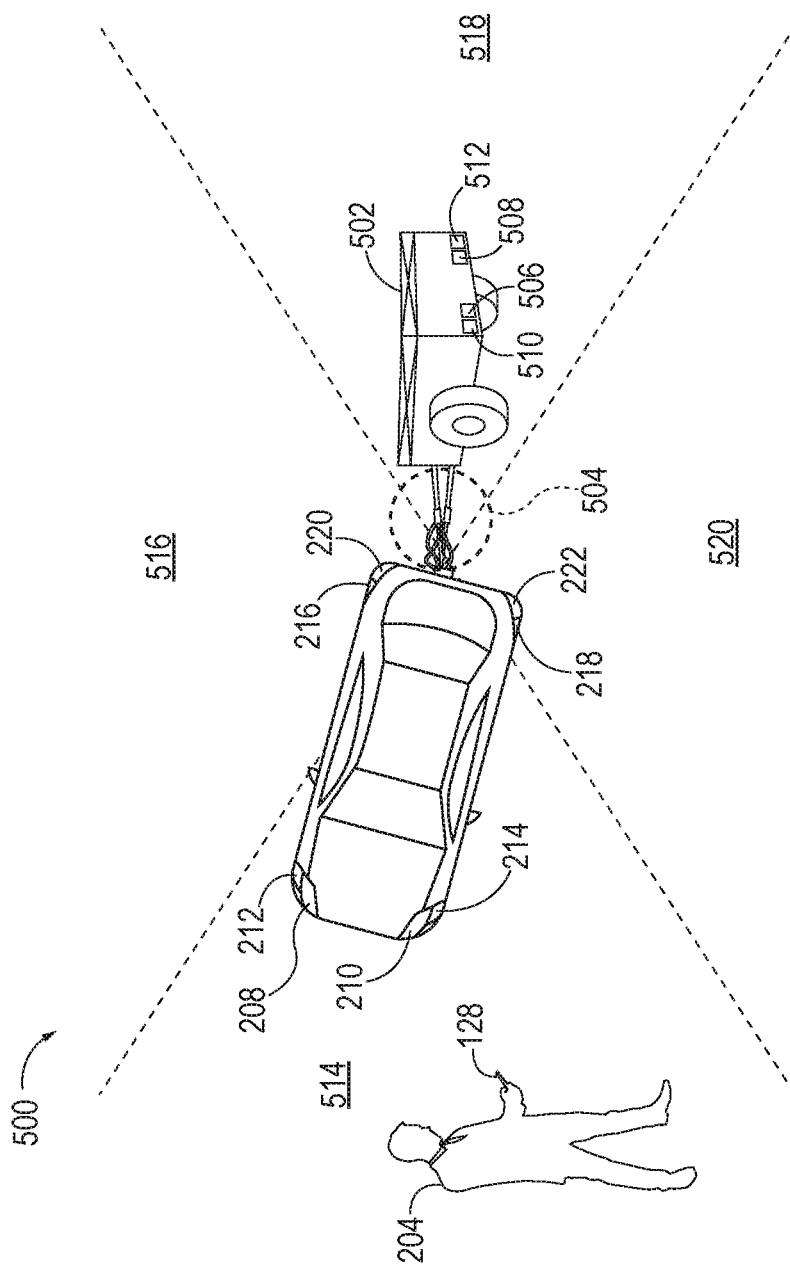
FIG. 5 is a schematic view of a host vehicle and a coupled device implementing a system for a remote vehicle light check according to an exemplary embodiment.

Although the previous examples are discussed with respect to a host vehicle 202 alone, different configurations vehicles, such as vehicle with coupled devices, may utilize the systems and methods described herein. For example, FIG. 5 is a schematic view 500 of a host vehicle and a coupled device implementing a system for a remote vehicle light check according to an exemplary embodiment. In FIG. 5 the coupled device 502 is a trailer, however, other types of coupled devices, such as light harnesses, towed vehicles, and portable sirens, among others may be used. The coupled device 502 is electrically connected to the host vehicle 202 using a connection apparatus 504. As shown the connection apparatus 504 is a physical wired connection, however, the connection apparatus 504 may be configured for wireless computer communication. For example, the coupled device 502 may be a wireless light harness.

As discussed above, the host vehicle 202 has a number of lights, for example, the first headlight 208, the second headlight 210, the first forward turn signal 212, the second forward turn signal 214, the first rear turn signal 216, the second rear turn signal 218, the first brake light 220, and the second brake light 222 form a first set of lights associated with the host vehicle 202. Likewise, the coupled device 502 has a set of associated lights. For example, the coupled device 502 may include a first coupled turn signal 506, a second coupled turn signal 508, a first coupled brake light 510, and a second coupled brake light 512 that form a second set of lights associated with the coupled device 502. In another example, the first set of lights of the host vehicle 202 may have a one-to-one correspondence with the second set of lights of the coupled device 502. In yet another example, the second set of lights may have a number of lights corresponding to a single light of the first set of lights of the host vehicle 202 and vice versa. For example, the second set of lights may correspond to similarly arranged lights of the first set of lights.

Figure 6:
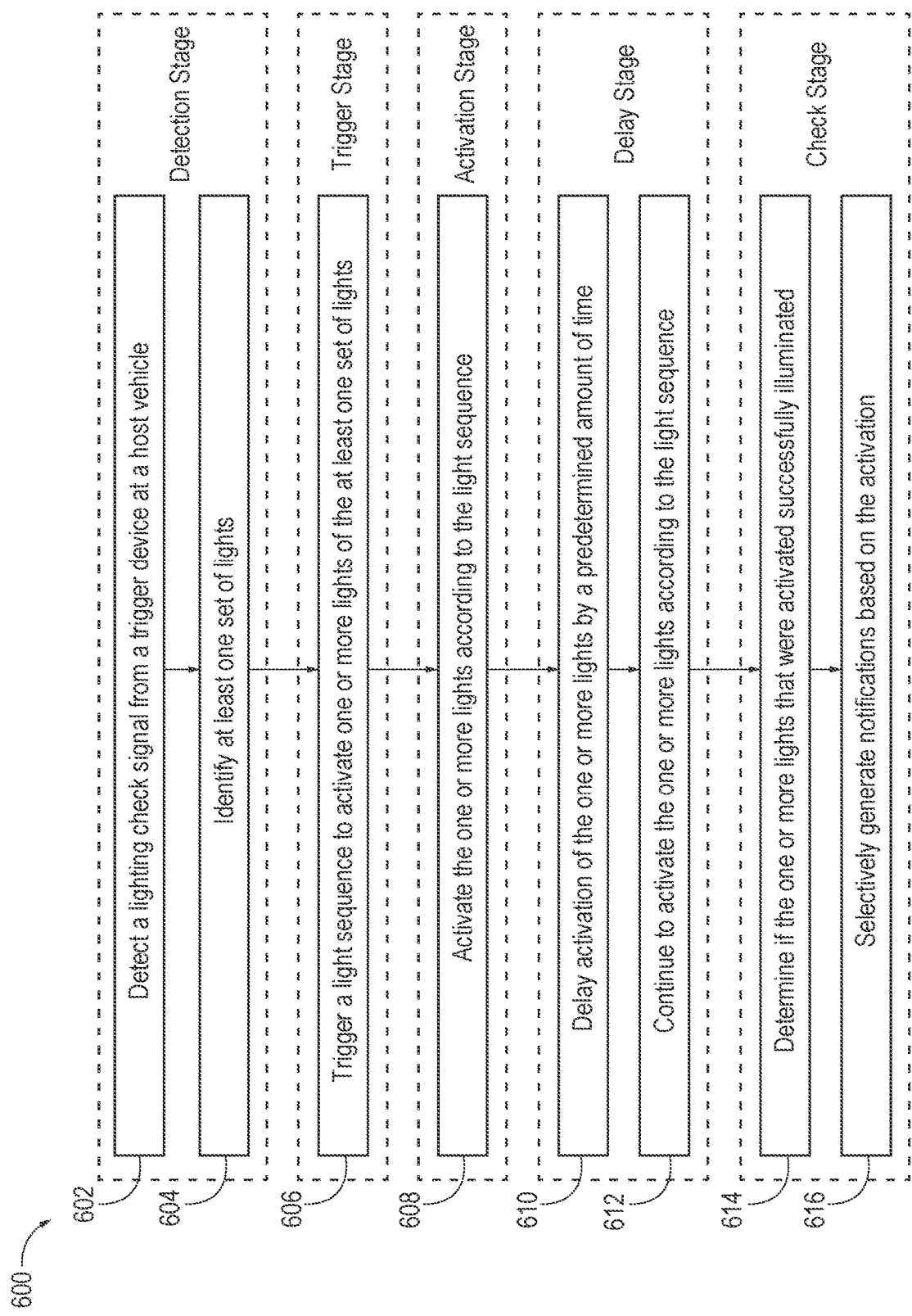
FIG. 6 is a process flow diagram of a method for a remote vehicle light check with a host vehicle and a coupled device according to an exemplary embodiment.

FIG. 6 is a process flow diagram of a method for a remote vehicle light check with a host vehicle and a coupled device according to an exemplary embodiment. FIG. 6 will also be described with reference to FIGS. 1-5 and 7. As shown in FIG. 4, the method for performing a remote vehicle light check can be described by four stages, namely, (A) detection, (B) trigger, (C) activation, and (D) delay. For simplicity, the method 600 of FIG. 6 will be described by these stages, as well as (E) a check stage but it is understood that the elements of the method 600 can be organized into different architectures, blocks, stages, and/or processes.

At block 602, the detection stage, for a host vehicle 202 having a coupled device 502, may include detecting a lighting check signal 206 at the host vehicle 202 from a trigger device 128, as described above with respect to FIG. 4. Here, the trigger device 128 is shown as a smart phone. Accordingly, the detection module 114 may receive the lighting check signal 206 from the trigger device 128 when the user 204 makes a selection on the trigger device 128.

Figure 7:
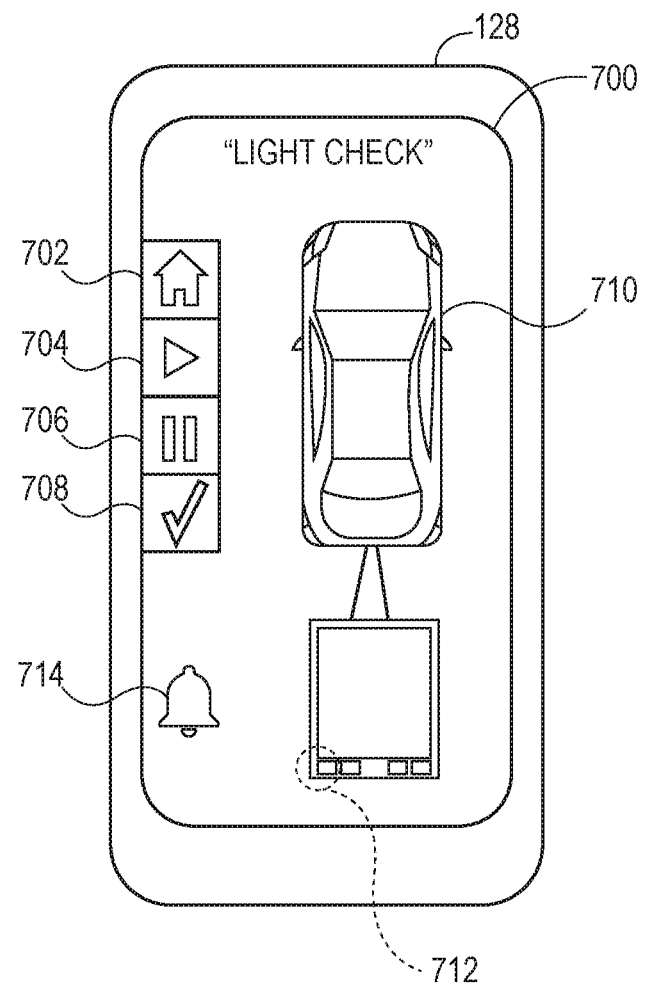
FIG. 7 is a schematic view of an exemplary visual representation of an application for implementing a remote vehicle light check according to an exemplary embodiment

Turning to FIG. 7, a schematic view of an exemplary visual representation of an application running on a trigger device 128 having a display 700 is shown. For example, the display 700 of the trigger device 128 may be the display of a portable device such as a smart phone and/or the in-vehicle display 314 of the infotainment system 306. In some embodiments where the trigger device is distributed over multiple devices, one or more stages may be carried out on different devices. For example, the application may be running on the infotainment system 306 such that the display 700 is displayed on the in-vehicle display 314. Accordingly, the lighting check signal 206 may be received from the in-vehicle display 314. However, the activation and delay stages may be performed based on a moving portable device as the trigger device 128, such as a key fob or smart phone, as described above.

The application may be an interface for providing a remote vehicle light check. The application includes a display interface rendered on the display 700. The display interface may include a number of inputs such as a home icon 702, a signal icon 704, a pause icon 706, and a check icon 708. The display interface may also include a vehicle graphic 710 that represents the host vehicle 202 and/or the coupled device 502. A user may select the signal icon 704 to transmit the lighting check signal 206 from the trigger device 128 or associated device which is then received by the detection module 114.

Returning to FIG. 6, at block 604, the detection stage includes identifying at least one set of light. For example, the at least one set of lights may include a first set of lights associated with the host vehicle 202 and/or a second set of lights associated with the coupled device 502 electrically connected to the host vehicle 202. Light information regarding the first set of lights and the second set of lights may be received at the detection module 114 from the vehicle systems 122 and/or the vehicle sensors 124 of the host vehicle 202. For example, the light system 302 may use vehicle sensors 124 to identify the lights using the electrical connection of the connection apparatus 504. In one embodiment, the detection module 114 may access the lighting database 138 to identify the first set of lights and/or the second set of lights. In another embodiment, the lighting check signal 206 may include light information regarding the first set of lights and/or the second set of lights.

At block 606, the trigger stage includes triggering a light sequence in response to the lighting check signal 206 being detected. The light sequence causes one or more lights of the first set of lights and/or the second set of lights to be activated in a similar manner as described above with respect to FIG. 4. In one embodiment, the light sequence is selected from a plurality of light sequences based on the type of the coupled device. For example, the electrical connection between the host vehicle 202 and the coupled device 502 may include a transfer of data between the host vehicle 202 and the coupled device 502. In another embodiment, the user 204 may input the type of device corresponding to the coupled device 502. For example, the user may have a home screen (not shown) corresponding to the home icon 702 that lists a number of types of coupled devices that the user 204 can select from.

At block 608, the activation stage includes activating the one or more lights of the first set of lights and/or the second set of lights identified in the light sequence to be activated in a similar manner as described above with respect to FIG. 4. For example, the trigger module 116 and/or the light systems 302 may access the coupled device 502 using an electrical connection of the connection apparatus 504 to activate one or more of the second set of lights. Accordingly, the trigger module 116 and/or the light systems 302 may initiate, coordinate, and manage the activation of the second set of lights of the coupled device 502.

At block 610, the delay stage includes pausing the activation of the one or more lights of the second set of lights by a predetermined delay. In one embodiment, the delay is initiated in response to vehicle data from the vehicle systems 122 and/or the vehicle sensors 124. In another embodiment, a pause signal may be received from the trigger device 128. Returning to FIG. 7, a user 204 may select the pause icon 706 at any point prior to or during the activation of the one or more lights in the first set of lights and/or the second set of lights to delay the activation.

At block 612, the delay stage includes continuing the light sequence from the point at which the light sequence was paused. This may occur after a predetermined amount of time. Alternatively, the activation of the lights may continue once the vehicle data indicates that the user 204 is in a quadrant situated for viewing lights that are upcoming in the light sequence. For example, in FIG. 5, zones including a forward zone 514, a passenger zone 516, a rear zone 518, and a driver zone 520 are shown. Suppose, the user 204 is initially in the rear zone 518 which automatically results in a delay immediately prior to the activation of the first headlight 208 and the second headlight 210. The delay may continue until the user 204 reinitiates the activation. For example, the user may select to resend the lighting check signal 206 by selecting the signal icon 704 or select the pause icon 706 a second time. In some embodiments, the reactivation of the light sequence may be based on the manner in which the light sequence was delayed. For example, if the user 204 used the display 700 to delay the activation, the activation may only continue in response to user input.

Returning to FIG. 6, at block 614, a check stage includes determining if the activated light successfully illuminated. In some embodiments, the host vehicle may use vehicle systems 122 and/or the vehicle sensors to determine if a light of the one or more lights successfully activated by illuminating. The user 204 may also request additional checks. Turning to FIG. 7, the user may select the check icon 708 to determine whether the one or more lights successfully illuminated.

At block 616, a check stage includes selectively generating a notification based on the determination. For example, suppose that a first coupled brake light 510 does not illuminate. The vehicle graphic 710, including a rendering of the coupled device 502, may flash a corresponding light element 712 and/or notification icon 714 to indicate to the user that at least one light has not been successfully activated. Although described with respect to the display 700 of the trigger device 128, the notification may additionally, alternatively, or simultaneously be displayed on the in-vehicle display 314 of the infotainments system 306. Therefore, the user 204 can be directed to look at a specific light from inside or outside of the host vehicle 202.

Moreover, as described, the lighting check signal can be initiated inside or outside of the host vehicle 202, the pause signal may be initiated from inside or outside of the host vehicle 202, and the check can be performed from inside or outside of the host vehicle 202. This allows the user to move about the host vehicle 202 during the remote vehicle light check, which is more efficient and convenient for the user 204.

The embodiments discussed herein may also be described and implemented in the context of non-transitory computer-readable storage medium storing computer-executable instructions. Non-transitory computer-readable storage media includes computer storage media and communication media. For example, flash memory drives, digital versatile discs (DVDs), compact discs (CDs), floppy disks, and tape cassettes. Non-transitory computer-readable storage media may include volatile and nonvolatile, removable and non-removable media implemented in any method or technology for storage of information such as computer readable instructions, data structures, modules, or other data. Non-transitory computer readable storage media excludes transitory and propagated data signals.

It will be appreciated that various implementations of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A computer-implemented method for a remote vehicle light check of a host vehicle having a plurality of lights, comprising:

detecting a lighting check signal at the host vehicle, wherein the lighting check signal is received from a trigger device;

determining a location of the trigger device in a zone of a plurality of zones that are exterior to the host vehicle, wherein the zone is a first zone or a second zone of the plurality of zones;

triggering a light sequence in response to the lighting check signal being detected, wherein the light sequence causes one or more lights of the plurality of lights to be activated, and wherein the light sequence is based on the zone; and activating the one or more lights based on the light sequence.

2. The computer-implemented method of claim 1, wherein the light sequence is received at the host vehicle from the trigger device.

3. The computer-implemented method of claim 1, wherein the light sequence is selected from a set of light sequences based on a coupled device being electrically connected to the host vehicle.

4. The computer-implemented method of claim 1, wherein the one or more lights include at least one headlight, at least one turn signal, and at least one brake light, and wherein the at least one headlight is activated by a headlight control system, the at least one turn signal is activated by a turn signal control system, and the at least one brake light is activated by a brake light control system.

5. The computer-implemented method of claim 4, wherein the light sequence includes instructions for the headlight control system, the turn signal control system, and the brake light control system.

6. The computer-implemented method of claim 1, further comprising:

determining if the one or more lights illuminated when activated;

selectively generating a notification based on the determination; and sending the notification to the trigger device.

7. The computer-implemented method of claim 6, wherein determining if the one or more lights illuminated is based on vehicle data received from vehicle sensors of the host vehicle.

8. The computer-implemented method of claim 1, further comprising:

pausing the activation of the one or more lights by a predetermined delay before continuing the activation of the one or more lights.

9. The computer-implemented method of claim 8, wherein pausing the activation further includes receiving a pause signal from the trigger device.

10. The computer-implemented method of claim 1, wherein the light sequence includes first activating one or more lights in the zone associated with the location of the trigger device.

11. A system for a remote vehicle light check of a host vehicle having a plurality of lights, comprising:

a memory storing instructions that when executed by a processor cause the processor to:

detect a lighting check signal from a trigger device at the host vehicle, wherein the lighting check signal identifies a first set of lights associated with the host vehicle and a second set of lights associated with a coupled device electrically connected to the host vehicle;

determine a location of the trigger device in a zone of a plurality of zones that are exterior to the host vehicle or the coupled device, wherein the zone is a first zone or a second zone of the plurality of zones; and trigger a light sequence in response to the lighting check signal being detected, wherein the light sequence causes one or more lights of the second set of lights to be activated, wherein the one or more lights of the second set of lights are activated based on the light sequence, and wherein the light sequence is based on the zone.

12. The system of claim 11, wherein the one or more lights of the second set of lights include at least one headlight, at least one turn signal, and at least one brake light, and wherein the at least one headlight is activated by a headlight control system, the at least one turn signal is activated by a turn signal control system, and the at least one brake light is activated by a brake light control system.

13. The system of claim 11, wherein the coupled device is a towed vehicle being towed by the host vehicle, and wherein the towed vehicle includes the second set of lights that correspond to the first set of lights of the host vehicle.

14. The system of claim 11, wherein the light sequence is selected from a plurality of light sequences based on a type of the coupled device.

15. The system of claim 11, wherein the instructions further cause the processor to pause the activation of the one or more lights of the second set of lights.

16. The system of claim 11, wherein the light sequence includes first activating one or more lights of the second set of lights in the zone associated with the location of the trigger device.

17. A non-transitory computer-readable storage medium storing instructions that, when executed by a computer, causes the computer to perform a method comprising:

detecting a lighting check signal at a host vehicle, wherein the lighting check signal is received from a trigger device;

determining a location of the trigger device in a zone of a plurality of zones that are exterior to the host vehicle, wherein the zone is a first zone or a second zone of the plurality of zones;

identifying a first set of lights associated with the host vehicle and a second set of lights associated with a coupled device that is electrically connected to the host vehicle;

triggering a light sequence in response to the lighting check signal being detected, wherein the light sequence is based on the zone; and activating one or more lights of the first set of lights or the second set of lights based on the light sequence.

18. The non-transitory computer-readable storage medium of claim 17, wherein the coupled device is a towed vehicle being towed by the host vehicle, and wherein the towed vehicle includes the second set of lights that correspond to similarly arranged lights of the first set of lights.

19. The non-transitory computer-readable storage medium of claim 17, wherein the instructions, when executed by the computer, further cause the computer to perform the step of pausing the activation of the one or more lights by a predetermined delay.

20. The non-transitory computer-readable storage medium of claim 17, wherein the light sequence includes first activating one or more lights of the first set of lights or the second set of lights in the zone associated with the location of the trigger device.

* * * * *